(12) United States Patent
Ng et al.

(10) Patent No.: US 7,427,718 B2
(45) Date of Patent: Sep. 23, 2008

(54) GROUND PLANE HAVING OPENING AND CONDUCTIVE BRIDGE TRAVERSING THE OPENING

(75) Inventors: Kok Siang Ng, Penang (MY); Loo Howe Yin, Penang (MY); Ahmad Jalaluddin Yusof, Pulau Pinang (MY)

(73) Assignee: Intel Corporation, Santa Clara, CA (US)

( * ) Notice: Subject to any disclaimer, the term of this patent is extended or adjusted under 35 U.S.C. 154(b) by 627 days.

(21) Appl. No.: 10/954,406

(22) Filed: Sep. 29, 2004

(65) Prior Publication Data

US 2006/0072298 A1 Apr. 6, 2006

(51) Int. Cl.
*H05K 1/03* (2006.01)
*H05K 3/02* (2006.01)
*H05K 3/10* (2006.01)

(52) U.S. Cl. .................... 174/255; 174/262; 29/846; 361/792

(58) Field of Classification Search ......... 361/792–795; 174/255, 262–266; 29/846–853
See application file for complete search history.

(56) References Cited

U.S. PATENT DOCUMENTS 5,875,136 A * 2/1999 Hsuan et al. ............. 365/200
6,657,130 B2 * 12/2003 Van Dyke et al. .......... 174/255
2005/0276030 A1 12/2005 Ng et al.
2006/0038734 A1 * 2/2006 Shtrom et al. ............. 343/795

OTHER PUBLICATIONS

Brooks, Douglas, "Brookspeak, Ground Plan 101", *Printed Circuit Design, A Miller Freeman Publication*, (Oct. 1997), 2 pages.
Brooks, Douglas, "Loop Areas, Close 'Em Tight!", *Printed Circuit Design Magazine*, (Jan. 1999), 3 pages.
Brooks, Douglas, "Slots in Plans, Don't Use 'Em!", *Printed Circuit Design, a Miller Freeman Publication*, (Mar. 1999), 2 pages.
Singh, P. , et al., "A power, packaging, and cooling overview of the IBM eServer z900", *IBM Journal Res. & Dev.*, vol. 46, No. 6, (Nov. 2002), pp. 711-738.

* cited by examiner

*Primary Examiner*—Jeremy C Norris
(74) *Attorney, Agent, or Firm*—Blakely, Sokoloff, Taylor & Zafman LLP (57) ABSTRACT

Conductive bridges to traverse openings in ground planes, and methods of making the conductive bridges, are disclosed. In one aspect, an apparatus may include a ground plane, one or more openings defined in the ground plane, such as, for example, conjoined via openings and/or slots, and one or more conductive bridges coupled with the ground plane that traverse the one or more openings.

22 Claims, 8 Drawing Sheets

WIRELESS DEVICE
850

PRINTED CIRCUIT
852

ANTENNA
854

GSM TRANSCEIVER
856

*FIG. 8*

GROUND PLANE HAVING OPENING AND CONDUCTIVE BRIDGE TRAVERSING THE OPENING

BACKGROUND

1. Field

One or more embodiments of the invention relate to a ground plane of a printed circuit.

2. Background Information

Many multi-layer printed circuits, such as, for example, printed circuit boards, printed wiring boards, and flexible printed circuits, may include planes dedicated to providing ground and power.

The ground planes may include openings, such as, for example via holes and/or slots, defined therein. In some printed circuits, via holes may be conjoined to form larger openings. Depending upon their number and size, the openings may potentially limit, divert, or at least affect the flow of currents, such as, for example, signal return currents, that may flow in the ground plane. Return currents tend to flow directly under or over lines or traces in the overlying or underlying signal layers. However, current often does not flow across openings in the ground plane to an appreciable extent. Rather, the current may be diverted around the openings.

Figure 1:
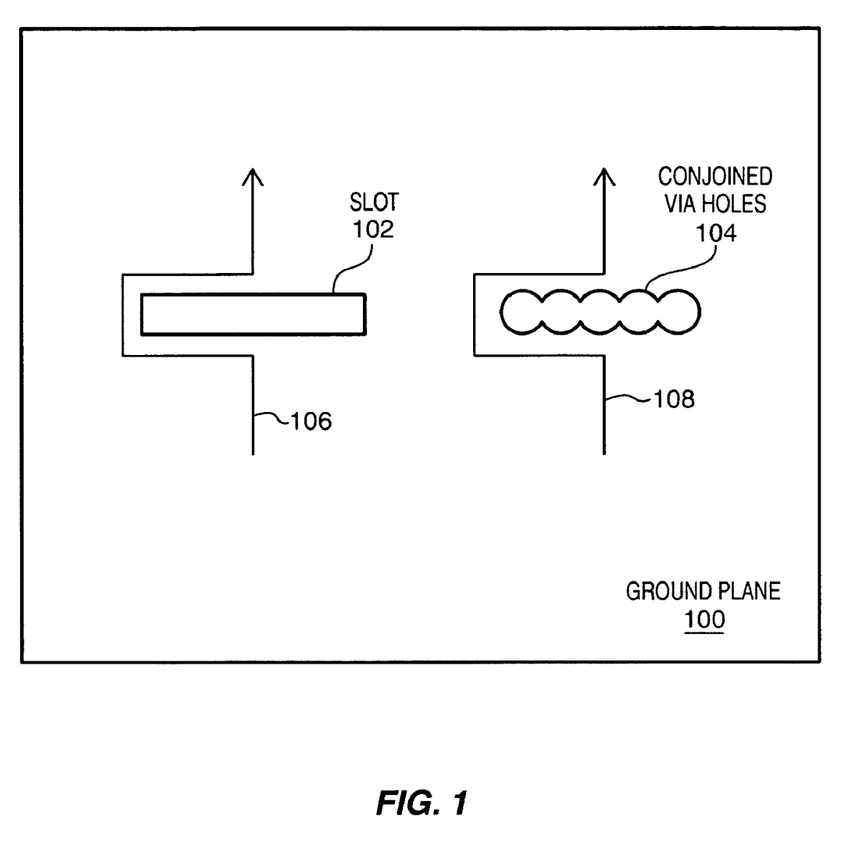
FIG. 1 shows diversion of signal return currents around a slot and conjoined via holes in a ground plane, according to one aspect.

FIG. 1 shows a ground plane 100 having a slot 102 and conjoined via holes 104 defined therein. A first arrow 106 shows how a signal return current may be diverted around the slot. A second arrow 108 shows how a signal return current may be diverted around the conjoined via holes.

The diversion of current around an opening may enlarge a current loop area. The enlarged loop area may result in an increase in impedance, electromagnetic interference, and signal integrity return loss, to name just a few potential problems.

BRIEF DESCRIPTION OF THE SEVERAL VIEWS OF THE DRAWINGS

The invention may best be understood by referring to the following description and accompanying drawings that are used to illustrate embodiments of the invention. In the drawings.

DETAILED DESCRIPTION

In the following description, numerous specific details are set forth. However, embodiments of the invention may be practiced without these specific details. In other instances, well-known circuits, structures and techniques have not been shown in detail in order not to obscure the understanding of this description.

Figure 2:
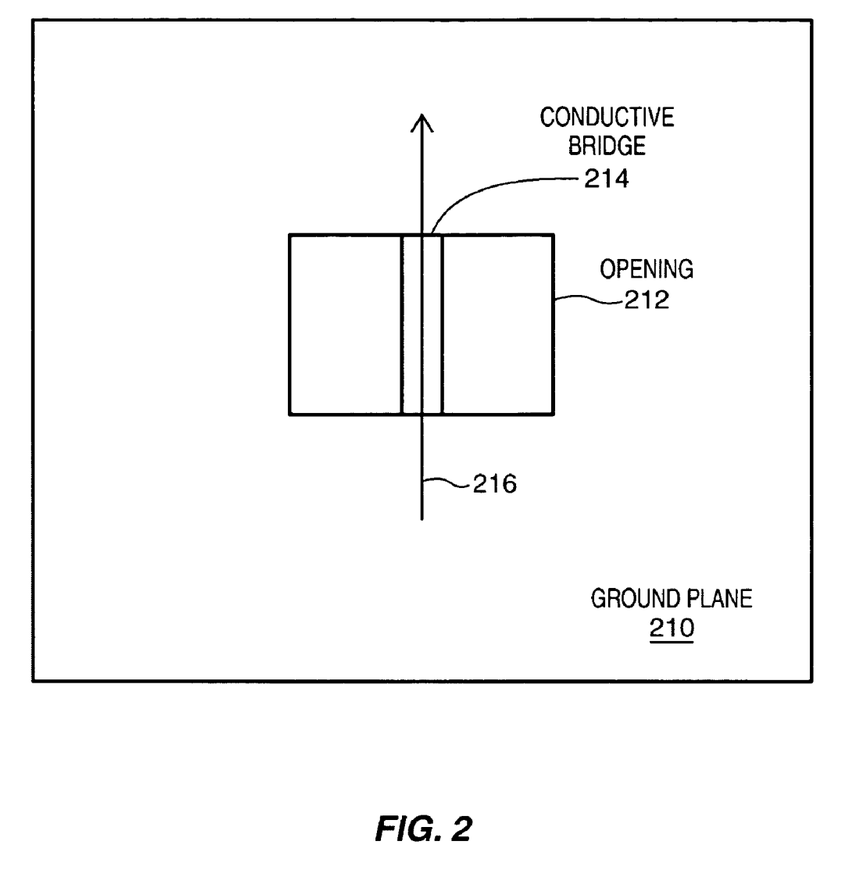
FIG. 2 shows a conceptual view of a ground plane, an opening defined in the ground plane, and a conductive bridge coupled with the ground plane that traverses the opening, according to one or more embodiments of the invention.

FIG. 2 shows a conceptual view of a ground plane 210, an opening 212 defined in the ground plane, and a conductive bridge 214 coupled with the ground plane that traverses the opening, according to one or more embodiments of the invention.

The ground plane may include a layer, sheet, or other flat planar structure including a conductive material, such as, for example, copper, gold, or another metal. The ground plane may optionally occupy a whole layer of a multi-layer printed circuit, although this is not required. The ground plane may be coupled with a negative voltage terminal, as opposed to a power plane, which may be coupled with a positive voltage terminal.

The opening may be defined in the ground plane. Suitable openings include, but are not limited to, via holes, conjoined via holes, and slots. Without limitation, the opening may be formed in the ground plane by cutting, drilling, etching, laser removal, or otherwise removing portions of the ground plane. The invention is not limited to any known size or shape of the opening, positioning of the opening on the ground plane, or method of formation of the opening.

The conductive bridge may be physically and electrically coupled with the ground plane and may cross or otherwise traverse the opening. In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical contact with each other. "Coupled" may mean that two or more elements are in direct physical or electrical contact. However, "coupled" may also mean that two or more elements are not in direct contact with each other, but yet still co-operate or interact with each other. For example, in one aspect, the conductive bridge may be coupled with the ground plane through an intermediate conductive material, such as, for example, a solder, other metal bonding material, or conductive adhesive, to name just a few examples.

In one or more embodiments of the invention, the conductive bridge may include a structure, such as, for example, a metal or other conductive line, trace, wire, signal path, or other conductive path that traverses the opening. The conductive bridge may be provided over, under, or in plane with the ground plane, or conductive bridges may be provided in a combination of such locations, such as, for example, both under and over the ground plane. The invention is not limited in this respect.

The bridge may include a conductive path that "stitches" the opening. As viewed, the conductive bridge has a first upper end that may be coupled with the ground plane on a first upper side of the opening and a second lower end that may be coupled with the ground plane on a second lower side of the opening. It should be noted that terms such as "upper", "lower", "top", "bottom", "horizontal", "vertical", "right", "left", and the like, are used herein to facilitate the description of the structure of the package "as illustrated". It will be evident that the apparatus may be used in a variety of orientations including inverted, sideways, and tilted orientations. In one aspect, the bridge may include tails at the ends thereof that lap the ground plane, such as, for example, in order to help couple the bridge with the ground plane, although the invention is not limited in this respect. In one aspect, the tails may also optionally be wider than a center portion of the bridges that traverse the opening, such as, for example, to further couple the bridge with the ground plane.

The conductive bridge may include a metal due, at least in part, to the generally high electrical conductivity provided by metals. Suitable metals include, but are not limited to, aluminum, chrome, copper, gold, nickel, platinum, tin, titanium, tungsten, and combinations thereof. As used herein, unless specified otherwise, the term metal includes pure metals, such as copper, as well as alloys or other mixtures, stacks, laminates, or other combinations of multiple metals. However, the invention is not limited to metals. Electrically conductive materials or conductors other than metals, such as, for example, electrically conductive polymers and/or doped semiconductors, may also optionally be included and used in the bridge.

The conductive bridge may be sized to allow flow of current. In one or more embodiments of the invention, depending upon the opening, the conductive bridge may have a width that may be less than about 100 micrometers (μm, one millionth of a meter). Bridges with larger widths may also optionally be included, if spacing between permits, although a width of about 100 μm may often be sufficient to allow signal return currents to flow. A smaller width, such as, for example, a width that may be less than about 50 μm, or less than about 30 μm, may also be appropriate for one or more embodiments, such as, for example, when the spacing available for the bridge may be more limited. As one example, in one or more embodiments where the opening may include a plurality of conjoined via holes, it may be appropriate to include a bridge with a width that is about equal to the smallest line width printed in the signal layers of the printed circuit, such as, for example, in order to provide clearance around interconnects in the via holes, although the invention is not limited in this respect. At present, certain high volume manufacturing printed circuit technologies allow forming lines with widths in the range of about 20 to 30 μm. Such widths are suitable for the conductive bridges, according to one or more embodiments of the invention. The width that may be printed may also likely decrease as technologies advance, and such smaller widths are also suitable for the conductive bridges. The depth or thickness of the bridge may depend upon the particular embodiment and type of printed circuit in which the ground plane is to be included. In one aspect, for a ground plane of a printed circuit used for packaging, the depth or thickness may optionally be in the range between about 15 to 25 μm. In another aspect, for a ground plane of a printed circuit for a daughtercard, motherboard, or the like, the depth or thickness may optionally be in the range between about 25 to 55 μm, although the invention is not limited to such depth or thickness.

Referring again to FIG. 2, as shown, the conductive bridge may optionally be located and oriented to traverse the opening from one elongated side thereof to another, although the scope of the invention is not limited in this respect. Traversing across an elongated axis of the opening may help to reduce loop current areas. As further shown, a single conductive bridge may be located at or proximate the center of the opening. This may be appropriate, for example, if currents may approach the opening from both sides of the center. Alternatively, in one or more other embodiments, multiple spaced apart bridges may be included over the opening to further reduce current loops.

As illustrated by arrow 216, current may flow across the opening over the conductive bridge. In one aspect, such flow of current over the conductive bridge may help to reduce a signal return path and current loop area. This may potentially help to reduce the loop inductance and reduce EMI. In a further aspect, the conductive bridges may help to reduce the power and/or ground pins of a die in the package by further shielding, such as, for example, from proximate high-speed signal pins. However, the scope of the invention is not limited in respect to these potential advantages.

Figure 3:
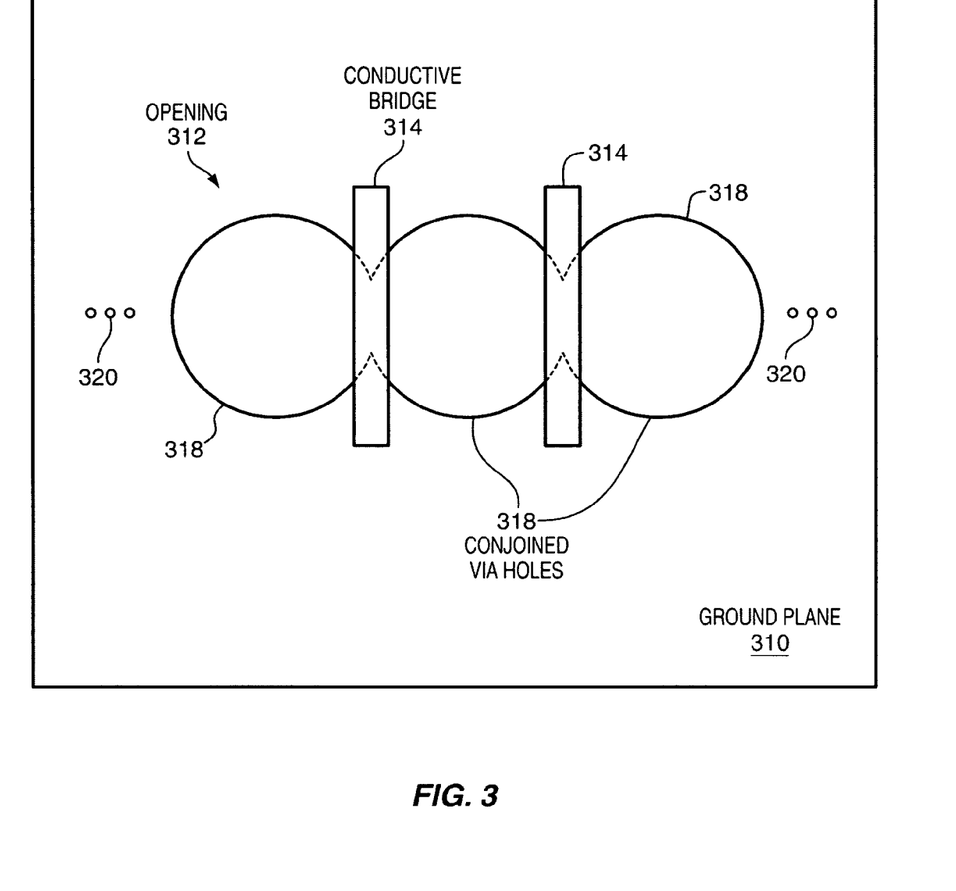
FIG. 3 shows an enlarged top planar view of a ground plane, conjoined vias defined in the ground plane, and conductive bridges coupled with the ground plane that traverse the conjoined vias, according to one or more embodiments of the invention.

FIG. 3 shows an enlarged top planar view of a ground plane 310, an opening 312 defined in the ground plane, and conductive bridges 314 coupled with the ground plane that traverse the opening, according to one or more embodiments of the invention. The ground plane, opening, and conductive bridges may optionally have some or all of the characteristics of the correspondingly named components shown in FIG. 2. To avoid obscuring the following description, the discussion below will primarily focus on the different and/or additional structures and characteristics of the components. Additionally, for simplicity and clarity of illustration, elements illustrated in the figures herein have not necessarily been drawn to scale. For example, the relative dimensions of the openings and bridges have been exaggerated relative to the ground plane and may have been exaggerated relative to each other for purposes of illustration.

The illustrated opening includes three conjoined via holes 318, although this is not required. Less, or more via holes 320, may also optionally be included. Numerous via holes, including conjoined via holes, are commonly found in microelectronic packages, such as, for example, high-speed input-output interface flip-chip packages. The openings tend to be prevalent near the die edge and/or near the package input/output ball out ring where pins and/or vias may be used to interconnect different layers of the package. The openings may also be found in other printed circuits, especially compact printed circuits, where numerous interconnections are made in a small area. The conjoined via holes may not allow, or at least may restrict, the flow of currents therethrough. Even if the via holes are not conjoined, the provision of a large number of via holes in a small area may significantly increase the resistance of the ground plane in the region, which may restrict the flow of current. The illustrated via holes are conjoined along a straight line, although the scope of the invention is not limited in this respect, as will be shown further below.

In one or more aspects, the via holes may each include a hole in the ground plane where copper or another conductive material of the ground plane has been removed, such as, for example, by laser removal, drilling, etching, or the like. As shown by the dashed lines, which are used to represent portions of the sidewalls of the via holes that are hidden in the illustration by the conductive bridges, the via holes may partially overlap, or at least touch on their sides. There may be no native copper or other conductive material of the ground plane disposed contiguously between the holes. That is, there may be no conductive path of the native ground plane material traversing the opening to allow a current to cross the opening.

Now, the via holes may not be empty. The openings may each include an interconnect, such as, for example, a via plug and contact pad, and an insulator disposed between the interconnect and the ground plane. The interconnects may be located toward the center of the via holes. In the assembled printed circuit, the interconnects may be coupled with conductive paths located in signal layers on opposite sides of the ground plane in order to interconnect the signal layers through the ground plane, for example. Accordingly, as used herein, the term "opening", such as, for example, an "opening" defined in the ground plane, does not imply that the opening is necessarily empty, as it may include other non-ground plane materials.

The conductive bridges are coupled with the ground plane and traverse the opening. In one or more embodiments of the invention, the bridges may be located and sized to avoid establishing an unintended electrical connection with the interconnects in the via holes. For example, as shown in the illustrated embodiment, the conductive bridges may traverse an elongated axis of the opening between the via holes, at least partially over the regions of overlap of the via holes. Both of which may help to increase the distance of separation of the bridges from the interconnects, which may be located toward the centers of the via holes.

The appropriate width of the conductive bridges may depend upon the size of the via holes, the size of the interconnects, such as, for example, the contact pads, and the amount of overlap between the via holes. For via holes in the ground plane with diameters of about 230 μm, having contact pads with cross-sectional dimensions of about 150 μm located toward their center, and with an overlap of the holes of about 20-40 μm, a width that may be less than about 35 μm, such as, for example, between about 20 to 35 μm, or less, may be appropriate for the conductive bridges. Such vias and interconnects may currently be found in certain printed circuit boards for flip chip microprocessor and chipset packages. The bridges with widths in these range may be readily manufactured using high volume manufacturing technologies. Larger widths may be appropriate in the case of larger via holes, smaller interconnects, and/or less overlap of the holes. Likewise, smaller widths may be appropriate in the case of smaller via holes, larger interconnects, or more overlap of the holes. These are just guidelines, as the scope of the invention is not limited to any known particular width for the conductive bridges disclosed herein. In one or more embodiments of the invention, if appropriate, bridges with different sizes may also optionally be included. For example, in one aspect, the widths of the conductive bridges may be proportional to, or at least related to, the amount of overlap of the via holes between which the conductive bridge may be disposed. By way of example, in one or more embodiments, a thinner bridge may be included between closely spaced or highly overlapping via holes, and a thicker bridge may be included between less closely spaced via holes.

Figure 4:
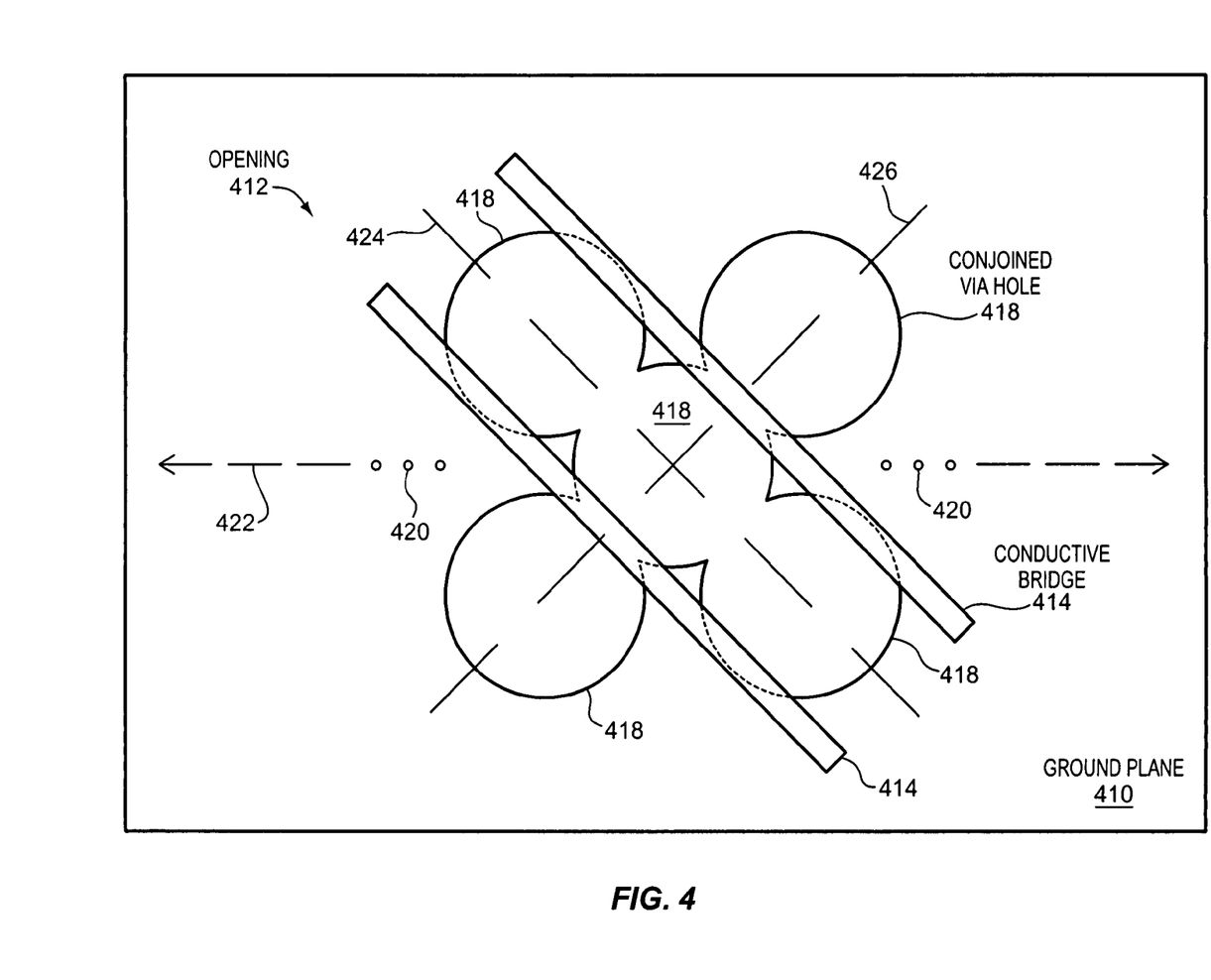
FIG. 4 shows an enlarged top planar view of a ground plane, a different arrangement of conjoined vias defined in the ground plane, and conductive bridges coupled with the ground plane that traverse the conjoined vias diagonally relative to an elongated axis of the opening, according to one or more other embodiments of the invention.

Now, the invention is not limited to the arrangement of via holes illustrated in FIG. 3. FIG. 4 shows an enlarged top planar view of a ground plane 410, an opening 412 defined in the ground plane, and conductive bridges 414 coupled with the ground plane that traverse the opening, according to one or more embodiments of the invention. The components shown in FIG. 4 may optionally have some or all of the characteristics of the correspondingly named components shown in FIGS. 2-3. To avoid obscuring the following description, the discussion below will primarily focus on the different and/or additional characteristics of the components shown in FIG. 4.

The illustrated opening includes five conjoined via holes 418, although the scope of the invention is not limited in this respect. Less, or more via holes 420, may also optionally be included. For example, as shown, the additional via holes may be conjoined to form an opening having an elongated horizontal axis 422. The illustrated via holes are conjoined along a first sidewall diagonal 424, and conjoined along a second sidewall diagonal 426. The sidewall diagonals form an "X".

The conductive bridges are coupled with the ground plane and traverse the opening. The bridges may include conductive paths that "stitch" the opening. As before, the bridges may be located and sized to avoid establishing an unintended electrical connection with the interconnects that may be located in the via holes. As shown in the illustrated embodiment, the conductive bridges may traverse an elongated axis of the opening between the via holes, over the regions of overlap or joining of the via holes. As shown in the illustrated embodiment, the bridges may traverse the opening in a direction that may be substantially aligned with and/or parallel to the conjoining sidewall diagonals. That is, for this particular layout of via holes, the conductive bridges may traverse the opening diagonally relative to the elongated axis of the opening. The illustrated bridges happen to be substantially aligned with the first sidewall diagonal 424, although this is not required. In one or more embodiments of the invention, the bridges may be substantially aligned with the second sidewall diagonal 426.

Figure 5:
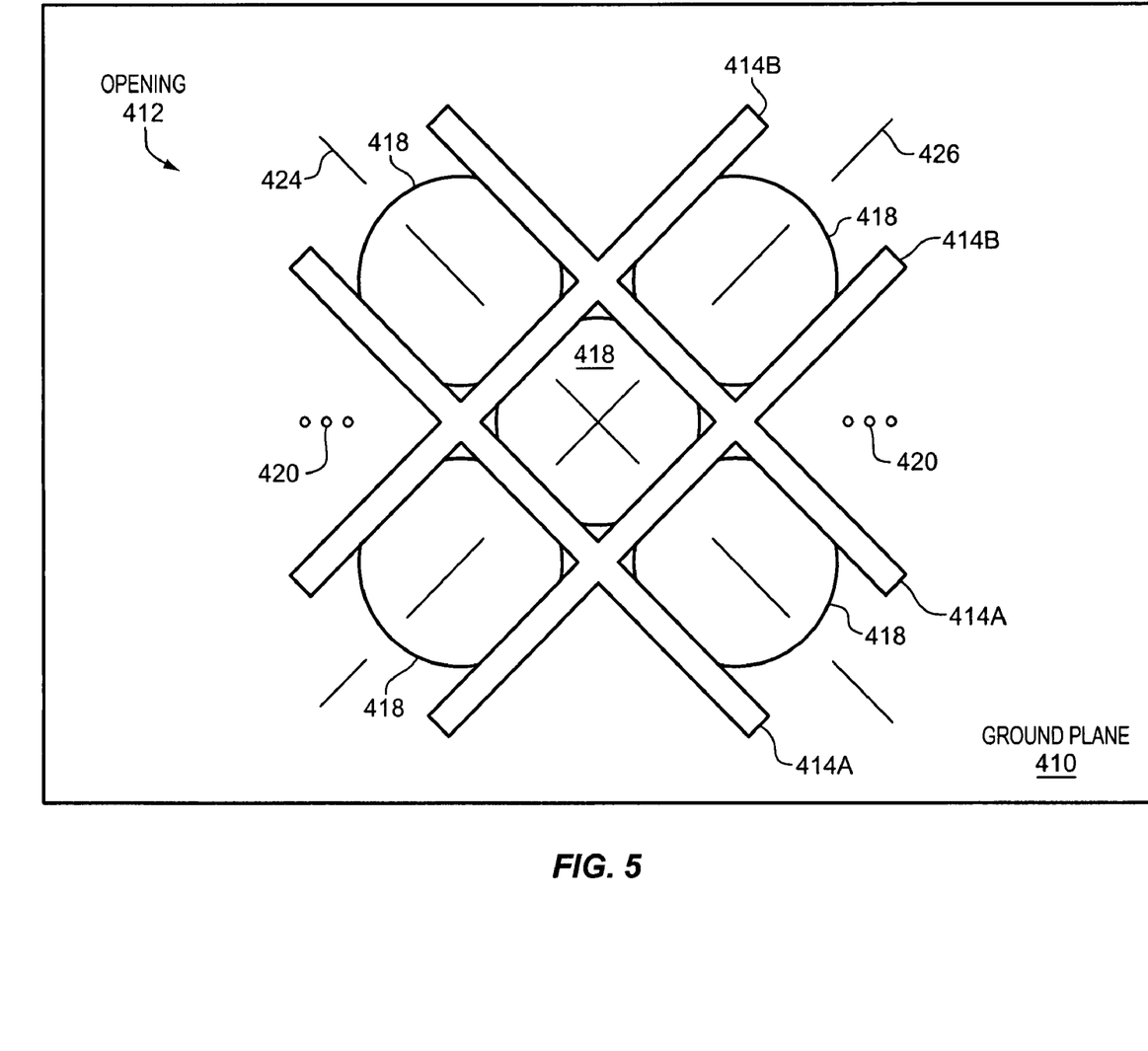
FIG. 5 shows an enlarged top planar view of crisscrossing or intersecting diagonal conductive bridges traversing the conjoined vias of FIG. 4, according to one or more other embodiments of the invention.

Additionally, according to one or more other embodiments, some of the bridges may be aligned with the first sidewall diagonal and other bridges may be aligned with the second sidewall diagonal. FIG. 5 shows an enlarged top planar view in which some bridges 414A are aligned with and/or parallel to the first sidewall diagonal 424, and other bridges 414B are aligned with and/or parallel to the second sidewall diagonal 426, according to one or more embodiments of the invention. The conductive bridges aligned with the first sidewall diagonal crisscross or intersect the conductive bridges aligned with the second sidewall diagonal. The bridges also traverse the two sidewall diagonals. The bridges may "cross-stitch" the opening with conductive paths.

Simulations have been performed in order to determine the affect of the conductive bridges on inductance and resistance of the ground plane for both alternating and direct currents at different operating frequencies. Three scenarios were simulated. A first scenario considered crisscrossing bridges and via holes as shown in FIG. 5 (column 2). A second scenario considered diagonal bridges and via holes as shown in FIG. 4 (column 3). In both the first and the second scenarios, the width of the bridges was about 20 μm, the depth of the bridges was about 15 μm. A third scenario considered via holes as shown in FIGS. 4 and 5 without conductive bridges (column 4). The percent change was calculated by comparing the first and the third scenarios. The results are shown in Tables 1 to 4.

TABLE 1

| | 100 MHz | | | |
|---|---|---|---|---|
| PROPERTY | BRIDGES OF FIG. 5 | BRIDGES OF FIG. 4 | NO BRIDGES | CHANGE (%) |
| AC INDUCTANCE | 1.6 | 1.6 | 2.0 | 20 |
| AC RESISTANCE | 4.0 | 4.6 | 8.8 | 54 |
| DC INDUCTANCE | 1.7 | 1.8 | 2.1 | 20 |
| DC RESISTANCE | 3.6 | 4.3 | 6.5 | 45 |

TABLE 2

400 MHz

| PROPERTY | BRIDGES OF FIG. 5 | BRIDGES OF FIG. 4 | NO BRIDGES | CHANGE (%) |
|---|---|---|---|---|
| AC INDUCTANCE | 1.6 | 1.6 | 2.0 | 20 |
| AC RESISTANCE | 8.1 | 9.1 | 17.5 | 54 |
| DC INDUCTANCE | 1.7 | 1.8 | 2.1 | 20 |
| DC RESISTANCE | 3.6 | 4.3 | 6.5 | 45 |

TABLE 3

800 MHz

| PROPERTY | BRIDGES OF FIG. 5 | BRIDGES OF FIG. 4 | NO BRIDGES | CHANGE (%) |
|---|---|---|---|---|
| AC INDUCTANCE | 1.6 | 1.6 | 2.0 | 20 |
| AC RESISTANCE | 11.4 | 12.9 | 24.8 | 54 |
| DC INDUCTANCE | 1.7 | 1.8 | 2.1 | 20 |
| DC RESISTANCE | 3.6 | 4.3 | 6.5 | 45 |

TABLE 4

1200 MHz

| PROPERTY | BRIDGES OF FIG. 5 | BRIDGES OF FIG. 4 | NO BRIDGES | CHANGE (%) |
|---|---|---|---|---|
| AC INDUCTANCE | 1.6 | 1.6 | 2.0 | 20 |
| AC RESISTANCE | 14.0 | 15.8 | 30.4 | 54 |
| DC INDUCTANCE | 1.7 | 1.8 | 2.1 | 20 |
| DC RESISTANCE | 3.6 | 4.3 | 6.5 | 45 |

The results demonstrate the utility of the conductive bridges to reduce the AC inductance, AC resistance, DC inductance, and DC resistance. The crisscrossing conductive bridges shown in FIG. 5 reduced the AC resistance, and DC inductance and resistance more than the non-crisscrossing conductive bridges shown in FIG. 4. The reductions in the inductance and resistance were maintained with increasing operating frequency over the range considered.

Figure 6:
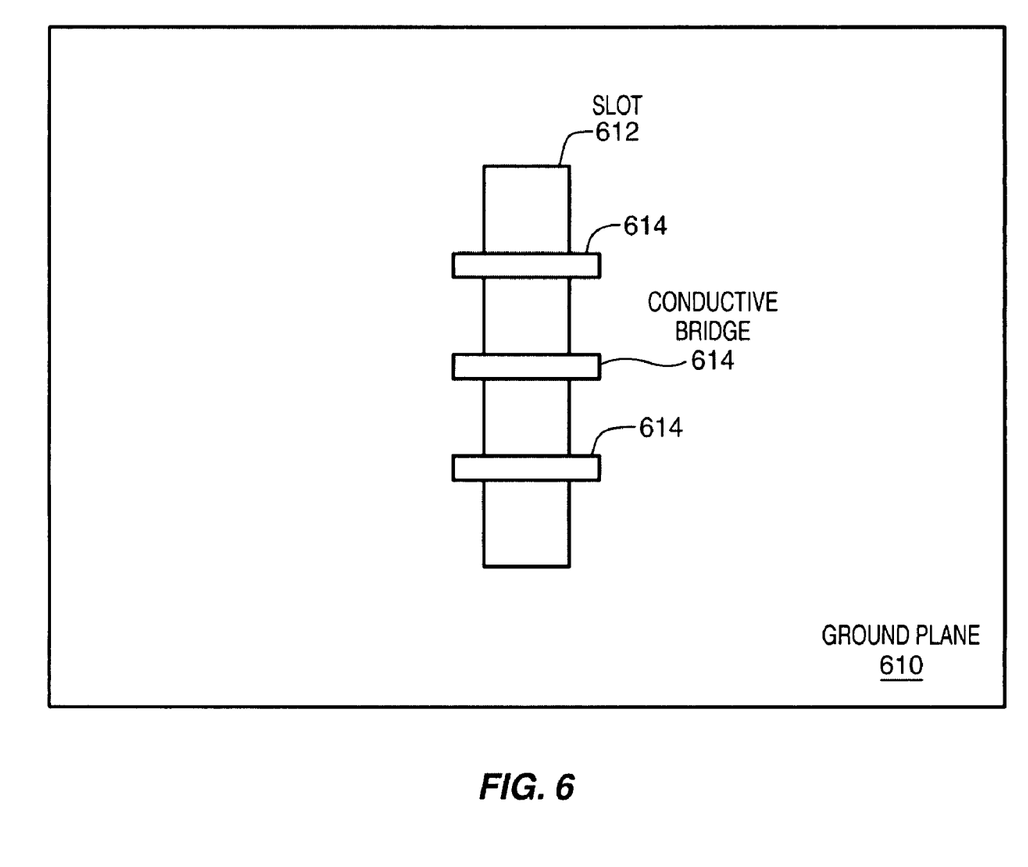
FIG. 6 shows an enlarged top planar view of a ground plane, a slot defined in the ground plane, and conductive bridges coupled with the ground plane that traverses the slot, according to one or more embodiments of the invention.

Another exemplary type of opening that may be included in a ground plane may be a slot. FIG. 6 shows an enlarged top planar view of a ground plane 610, a slot 612 defined in the ground plane, and conductive bridges 614 coupled with the ground plane that traverse the slot, according to one or more embodiments of the invention. As shown, the bridges may traverse the slot from one elongated side thereof to another. The conductive bridges may be spaced apart along the length of the slot.

A number of illustrative ground planes, openings, and conductive bridges have been disclosed above to illustrate certain features. The invention is not limited to these particular ground planes, openings, or conductive bridges. Many further modifications and variations are contemplated. For example, a bridge may have angles and/or curves, such as, for example, to zigzag or curve around the perimeters of the via holes. The invention is not limited to the particular arrangements of via holes disclosed herein. It will be appreciated that a variety of other suitable arrangements of conjoined via holes may be found in the numerous printed circuits available on the market. Still further, an opening need not include a via hole or slot in the ground plane, but rather may include a tear, cut, split, or other opening in the ground plane. One or more embodiments of the invention are not limited to any known size, shape, position, or method by which the opening is formed in the ground plane. Nor is the invention limited to the particular ground planes shown. Other ground planes, such as, for example, flexible ground planes, curved or bent (non-planar) ground planes, and circular or otherwise shaped ground planes are also suitable. There is no requirement that the ground plane be planar, as it may be flexible or curved.

One or more other embodiments of the invention may be directed to methods of forming the one or more conductive bridges over the opening in the ground plane. A method, according to one or more embodiments of the invention, may include forming an opening, such as, for example, conjoined via openings or a slot, in a ground plane, and forming one or more conductive bridges that are each coupled with the ground plane and that traverse the opening. Suitable methods of forming the opening include, but are not limited to, drilling, etching, laser removal of material of the ground plane, and other methods known in the printed circuit arts.

In one or more embodiments of the invention, the one or more conductive bridges may be formed lithographically. For example, a conductive layer, such as, for example, a copper or other metal layer, may be deposited over the opening in the ground plane. Suitable methods of depositing the conductive layer include, but are not limited to, chemical vapor deposition, physical vapor deposition, such as, for example, sputtering or evaporation, and plating, such as, for example, electroplating and electroless plating. Then, the conductive layer may be patterned. For example, a layer of photoresist may be formed over the conductive layer and exposed to patterned radiation through a mask. Depending upon the particular photoresist, exposed or unexposed portions of the resist may be removed during development, leaving a patterned resist layer over the conductive layer. Portions of the conductive layer may be selectively removed, such as, for example, by etching, according to the patterned resist layer. The removal of the portions of the conductive layer may form the conductive bridges, which may have one or more of the characteristics disclosed herein. Then, the remaining patterned resist layer may be removed, such as, for example, by resist stripping. This is just one example, and other methods, such as, for example, based on laser micromachining, may also optionally be used.

The apparatus disclosed elsewhere herein may be included in printed circuits, such as, for example, multi-layer printed circuits. As used herein, the term printed circuit includes, but is not limited to, printed circuit boards, printed wiring boards, and flexible printed circuits, as they are known in the arts.

Figure 7:
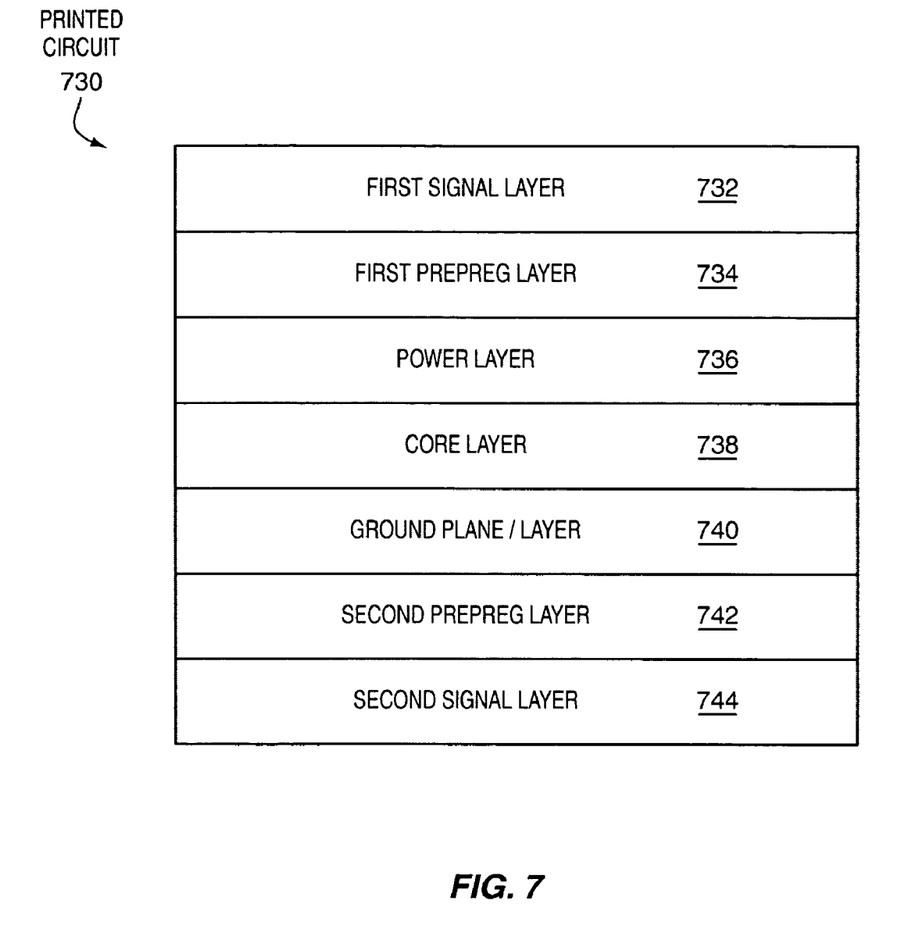
FIG. 7 shows an exploded perspective view of a printed circuit including a ground plane that may have an opening and conductive bridges as disclosed herein, according to one or more embodiments of the invention.

FIG. 7 shows a cross-sectional view of an exemplary printed circuit 730 including a ground plane or layer 740 having conductive bridge as disclosed herein, according to one or more embodiments of the invention. The printed circuit includes, from top to bottom, a first signal layer 732, a first insulating layer 734, a power layer 736, a core 738, the ground layer or plane 740, a second insulating layer 742, and a second signal layer 744.

The printed circuit may be referred to as a four-layer printed circuit because it includes the first and the second signal layers, the power layer, and the ground layer. The signal layers, the power layer, and the ground layer, may each include conductive materials. Electrical components and/or test pins, for example, may be coupled with conductors of the first and the second signal layers, which in the illustrated printed circuit are outer layers. Electrical signals may be routed to and/or from the electrical components and/or test pins through patterned conductors of the signal layers. The power and ground layers may help to define the voltages supplied to electrical components coupled with the printed circuit. As discussed, the ground layer may carry current, such as, for example, signal return currents. The core layer may include an insulator, which may be either rigid or flexible, and may include patterned conductors coupled with opposite sides of the insulator. The insulating layers may be used to bond materials or layers on opposite sides thereof together, and may include an insulating material, such as, for example, that used in the core.

The invention is not limited to this particular printed circuit, which is just one illustrative example. Various other suitable printed circuits may include, for example, from two to about sixteen layers, and may have a wide variety of different arrangements of the layers. Some of the suitable printed circuits may include multiple power and/or ground planes, such as, for example, to provide different supply voltages to the various electrical components coupled with the printed circuit.

Certain printed circuits may be used to couple electronic components, such as, for example, dice or other microelectronic devices, to form microelectronic packages. The packages may either be single or multi-chip packages. Other printed circuits may be used to couple electronic components to form expansion boards or cards. Expansion boards or cards are also occasionally known in the arts as daughterboards or daughtercards. The boards or cards may be used, for example, in computer systems, as controller boards, network interface cards, video adapters, or graphics cards, to name just a few examples. Still other printed circuits may be used to couple electronic components and/or other printed circuits, such as, for example, expansion boards or cards, in order to form a motherboard. Motherboards are also occasionally known in the arts as system boards, mainboards, back planes, or matrix boards. Other suitable examples, types, and uses of printed circuits are known in the arts.

In one or more embodiments of the invention, a printed circuit including a ground plane and conductive bridge as disclosed herein may be included and used in an electronic device. Suitable electronic devices include, but are not limited to, wireless devices, computer systems, televisions, video recorders, and networking equipment, to name just a few examples.

Figure 8:
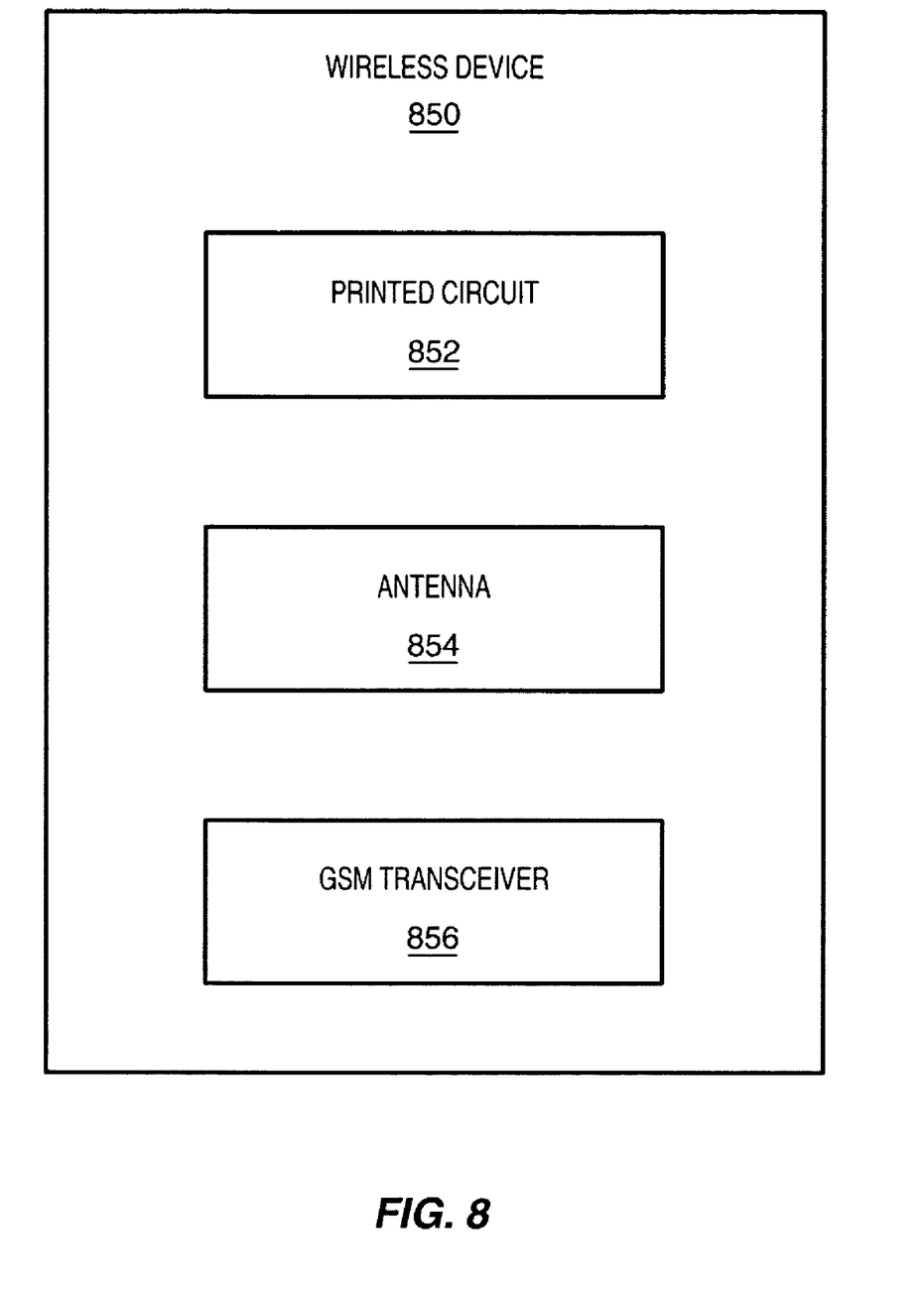
FIG. 8 shows a wireless device including a printed circuit having a ground plane and conductive bridges as disclosed herein, according to one or more embodiments of the invention.

FIG. 8 shows a wireless device 850, according to one or more embodiments of the invention. The wireless device may include a cellular phone, personal digital assistant (PDA), laptop computer, computer card (for example local area network (LAN) card), router, or base station, to name just a few examples.

The wireless device includes a printed circuit 852, which, in one or more embodiments of the invention, may include a ground plane and conductive bridge as disclosed elsewhere herein. The printed circuit may include a microelectronic device and/or other circuit that may operate at high frequencies that may tend to exacerbate EMI and other potential problems due to enlarged signal return loop areas. In one aspect, the conductive bridge may tend to reduce the signal return loop areas and improve performance of the wireless device, although the invention is not limited in this respect.

The wireless device also includes an antenna 854, such as, for example, an omnidirectional antenna or dipole antenna, and a GSM (Global System for Mobile communications) transceiver 856. The antenna may allow the wireless device to send and receive data. The GSM transceiver may allow the apparatus to utilize CDMA (Code Division Multiple Access), TDMA (Time Division Multiple Access), and/or W-CDMA (Wideband Code Division Multiple Access) communications, for example. Dipole antennas, omnidirectional antennas, and GSM transceivers are used in some, but not all, wireless devices. The wireless device may also include other optional components, which are not shown, such as a Flash memory, for example.

As discussed, a printed circuit including a ground plane and conductive bridge as disclosed herein may also optionally be included in a computer system, such as, for example, a desktop, laptop, or server. The computer system may include a bus, a processor coupled with the bus, and a memory coupled with the bus. Suitable memories that are used in some, but not all, computer systems include DRAM, SRAM, and Flash memories. The computer system may optionally include a graphics controller and/or audio device, which may be coupled with the bus. Graphics controllers and/or audio devices are included in some, but not all, computer systems. The printed circuit may be used to package a microelectronic device, such as, for example, a microprocessor or other chipset component, or may be used as a daughterboard, or motherboard, to name just a few examples.

In the description above, for the purposes of explanation, numerous specific details have been set forth in order to provide a thorough understanding of the embodiments of the invention. It will be apparent, however, to one skilled in the art, that other embodiments may be practiced without some of these specific details. In other instances, well-known circuits, structures, devices, and techniques have been shown in block diagram form or without detail in order not to obscure the understanding of this description.

Many of the methods are described in their most basic form, but operations may be added to or deleted from the methods. It will be apparent to those skilled in the art that many further modifications and adaptations may be made. The particular embodiments are not provided to limit the invention but to illustrate it. The scope of the invention is not to be determined by the specific examples provided above but only by the claims below.

In the claims, any element that does not explicitly state "means for" performing a specified function, or "step for" performing a specified function, is not to be interpreted as a "means" or "step" clause as specified in 35 U.S.C. Section 112, Paragraph 6. In particular, the use of "step of" in the claims herein is not intended to invoke the provisions of 35 U.S.C. Section 112, Paragraph 6.

It should also be appreciated that reference throughout this specification to "one embodiment", "an embodiment", or "one or more embodiments" means that a particular feature may be included in the practice of the invention, although this is not required. Similarly, it should be appreciated that in the foregoing description of exemplary embodiments of the invention, various features are sometimes grouped together in a single embodiment, Figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

While the invention has been described in terms of several embodiments, those skilled in the art will recognize that the invention is not limited to the embodiments described, but may be practiced with modification and alteration within the spirit and scope of the appended claims. The description is thus to be regarded as illustrative instead of limiting.

What is claimed is:

1. An apparatus comprising:
a ground plane;
one or more openings defined in the ground plane; and
one or more conductive bridges coupled with the ground plane that traverse the one or more openings,
wherein the one or more openings comprise a plurality of conjoined openings.

2. The apparatus of claim 1, wherein the one or more conductive bridges comprise one or more conductive lines.

3. The apparatus of claim 2, wherein one or more conductive lines comprise one or more metal lines.

4. The apparatus of claim 2, wherein one or more conductive lines comprise one or more conductive lines having a width that is less than 30 μm.

5. The apparatus of claim 1, wherein the one or more conductive bridges comprise one or more conductive bridges that traverse the opening diagonally.

6. The apparatus of claim 5, wherein the one or more conductive bridges that traverse the opening diagonally comprise conductive bridges that intersect over the opening.

7. The apparatus of claim 1, wherein the plurality of conjoined openings comprise a plurality of conjoined via holes.

8. The apparatus of claim 7, wherein the via holes are conjoined along sidewall diagonals, and wherein the one or more conductive bridges comprise one or more conductive bridges that traverse the conjoining sidewall diagonals.

9. The apparatus of claim 8, wherein the one or more conductive bridges that traverse the conjoining sidewall diagonals comprise two or more conductive bridges that crisscross the conjoining sidewall diagonals.

10. The apparatus of claim 1, wherein the one or more conductive bridges comprise a plurality of conductive bridges that are spaced apart along an elongated side of the plurality of conjoined openings and that traverse the plurality of conjoined openings.

11. An electronic device comprising: a printed circuit including the apparatus of claim 1; and a Flash memory.

12. An apparatus comprising:
an omnidirectional antenna; and
a printed circuit, the printed circuit including:
a ground plane;
one or more openings defined in the ground plane; and
one or more conductive bridges coupled with the ground plane that traverse the one or more openings,
wherein the one or more openings comprise a plurality of conjoined via holes.

13. The apparatus of claim 12, wherein the one or more conductive bridges comprise one or more conductive lines.

14. The apparatus of claim 13, wherein one or more conductive lines comprise one or more metal lines having a width that is less than 30 μm.

15. The apparatus of claim 12, wherein the one or more conductive bridges comprise one or more conductive bridges that traverse the opening diagonally.

16. The apparatus of claim 15, wherein the one or more conductive bridges that traverse the opening diagonally comprise conductive bridges that intersect over the opening.

17. A method comprising:
forming a plurality of conjoined openings in a ground plane; and
forming one or more conductive bridges that are each coupled with the ground plane and that traverse the plurality of conjoined openings.

18. The method of claim 17, wherein said forming the plurality of conjoined openings comprises forming a plurality of conjoined vias, and wherein said forming the one or more conductive bridges comprises forming one or more conductive lines.

19. The method of claim 18, wherein said forming the one or more conductive lines comprises forming one or more conductive lines having widths that are less than 30 μm.

20. The method of claim 18, wherein said forming the one or more conductive lines comprises forming one or more metal lines that include copper.

21. The method of claim 18, wherein said forming the one or more conductive lines comprises forming one or more conductive lines by depositing a metal layer and patterning the metal layer using lithography to form the one or more conductive lines.

22. An apparatus comprising:
a ground plane;
an elongated opening defined in the ground plane, the elongated opening selected from a plurality of conjoined openings and a slot;
a plurality of interconnects in the elongated opening;
an insulator disposed between the plurality of interconnects in the elongated opening and the ground plane; and
one or more conductive bridges coupled with the ground plane that traverse the elongated opening,
wherein the one or more conductive bridges are located and sized to avoid electrical connection with the interconnects.

* * * * *